United States Patent
Chang et al.

(10) Patent No.: US 8,420,550 B2
(45) Date of Patent: Apr. 16, 2013

(54) METHOD FOR CLEANING BACKSIDE ETCH DURING MANUFACTURE OF INTEGRATED CIRCUITS

(75) Inventors: Yan Wu Chang, Shanghai (CN); Tek Sing Lim, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 11/611,403

(22) Filed: Dec. 15, 2006

(65) Prior Publication Data

US 2008/0142052 A1    Jun. 19, 2008

(51) Int. Cl.
*H01L 21/302*    (2006.01)
*H01L 21/461*    (2006.01)

(52) U.S. Cl.
USPC ............... 438/748; 438/692; 257/E21.23

(58) Field of Classification Search .......... 438/745, 438/749, 750, 692, 58, 115, 142, 310, 402, 438/471–477, 905, 906, 748
See application file for complete search history.

(56) References Cited

U.S. PATENT DOCUMENTS

| | | | |
|---|---|---|---|
| 5,494,849 A * | 2/1996 | Iyer et al. | 438/459 |
| 5,937,312 A * | 8/1999 | Iyer et al. | 438/459 |
| 6,203,625 B1 * | 3/2001 | Derie et al. | 134/3 |
| 6,265,328 B1 * | 7/2001 | Henley et al. | 438/782 |
| 7,112,289 B2 * | 9/2006 | Mori et al. | 252/79.1 |
| 7,267,726 B2 * | 9/2007 | Xia | 134/3 |
| 2004/0007559 A1 * | 1/2004 | Hongo et al. | 216/37 |
| 2004/0026692 A1 * | 2/2004 | Ota et al. | 257/40 |
| 2004/0211442 A1 * | 10/2004 | Xia | 134/3 |

OTHER PUBLICATIONS

"Surfactant." Encyclopdia Britannica. Encyclopdia Britannica Online. Dec. 8, 2010 <http://www.britannica.com/EBchecked/topic/575010/surface-active-agent>.*

* cited by examiner

*Primary Examiner* — Michelle Mandala
*Assistant Examiner* — Shaka White
(74) *Attorney, Agent, or Firm* — Kilpatrick Townsend & Stockton LLP

(57) ABSTRACT

A method for manufacturing semiconductor substrates. The method includes providing a semiconductor wafer, which has an upper surface, a backside surface, and an edge region around a periphery of the semiconductor wafer. In a preferred embodiment, the upper surface is often for the manufacture of the integrated circuit device elements themselves. The method includes subjecting the semiconductor wafer to one or more process steps to form one or more films of materials on the backside surface. The method mounts the semiconductor wafer to expose the backside surface. The method rotates the semiconductor wafer in a circular manner. In a specific embodiment, the method includes supplying an acid solution containing fluorine bearing species, a nitric acid species, a surfactant species, and an organic acid species, on at least the backside surface as the semiconductor wafer rotates. The method causes removal of one or more contaminants from the backside surface, while a portion of the center region of the backside surface remains exposed as the semiconductor wafer rotates in the circular manner.

9 Claims, 12 Drawing Sheets

| SPLIT2 | Before backside etch | after backside etch |
|---|---|---|
| N: | 300 | 1350 |
| Ave: | 70.7955 | 80.7508 |
| StD: | 2.41864 | 2.76443 |
| LCL: | | |

METHOD FOR CLEANING BACKSIDE ETCH DURING MANUFACTURE OF INTEGRATED CIRCUITS

BACKGROUND OF THE INVENTION

The present invention is directed to integrated circuits and their processing for the manufacture of semiconductor devices. More particularly, the invention provides a method and device for manufacturing a semiconductor substrate using a back side clean, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of a process that has limitations based upon a given feature size is cleaning of backside surfaces of processed wafers during the manufacture of integrated circuits. Such backside surfaces often become contaminated with processing of upper surfaces, which are used for the integrated circuit devices themselves. The backside surfaces often become a source of particles and/or small silicon slivers that lead to failure of specific device elements and other limitations. These and other limitations of the conventional MOS transistor devices can be found throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and device for manufacturing a semiconductor substrate using a back side clean, but it would be recognized that the invention has a much broader range of applicability.

In a specific embodiment, the present invention provides a method for manufacturing semiconductor substrates, e.g., silicon substrate, silicon on insulator substrates, epitaxial silicon, for integrated circuits and other devices. The method includes providing a semiconductor wafer, which has an upper surface, a backside surface, and an edge region around a periphery of the semiconductor wafer. In a preferred embodiment, the upper surface is often for the manufacture of the integrated circuit device elements themselves, e.g., MOS transistors, capacitors, memory structures. The method includes subjecting the semiconductor wafer to one or more process steps to form one or more films of materials on the backside surface. In a specific embodiment, the one or more processes can be any of those used in the manufacture of integrated circuits, such as deposition, etching, polishing, plating, implanting, thermal treatment, any combination of these, and others. The method mounts the semiconductor wafer to expose the backside surface. The method rotates the semiconductor wafer in a circular manner. In a specific embodiment, the method includes supplying an acid solution containing fluorine bearing species, a nitric acid species, a surfactant species, and an organic acid species, on at least the backside surface as the semiconductor wafer rotates. The method causes removal of one or more contaminants from the backside surface and forms an edge exclusion region within a vicinity of the edge region around the periphery of the semiconductor wafer of at least 0.8 millimeter and greater, while a portion of the center region of the backside surface remains exposed as the semiconductor wafer rotates in the circular manner.

In an alternative specific embodiment, the present invention provides a method for manufacturing semiconductor substrates, e.g., silicon substrate, silicon on insulator substrates, epitaxial silicon, for integrated circuits and other devices. The method includes providing a semiconductor wafer, which has an upper surface, a backside surface, and an edge region around a periphery of the semiconductor wafer. In a preferred embodiment, the upper surface is often for the manufacture of the integrated circuit device elements themselves, e.g., MOS transistors, capacitors, memory structures. The method includes subjecting the semiconductor wafer to one or more process steps to form one or more films of materials on the backside surface. In a specific embodiment, the one or more processes can be any of those used in the manufacture of integrated circuits, such as deposition, etching, polishing, plating, implanting, thermal treatment, any combination of these, and others. The method mounts the semiconductor wafer to expose the backside surface. The method rotates the semiconductor wafer in a circular manner. In a specific embodiment, the method includes supplying an acid solution containing fluorine bearing species, a nitric acid species, a surfactant species, and an organic acid species, on at least the backside surface as the semiconductor wafer rotates. The method causes removal of one or more contaminants from the backside surface, while a portion of the center region of the backside surface remains exposed as the semiconductor wafer rotates in the circular manner.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved backside cleaning process to remove contaminants caused by formation of one or more films on upper surfaces that are for integrated circuits. The improved backside cleaning process also forms a wider edge exclusion region, which is free from silicon slivers and/or other particles that lead to device operability and reliability problems. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
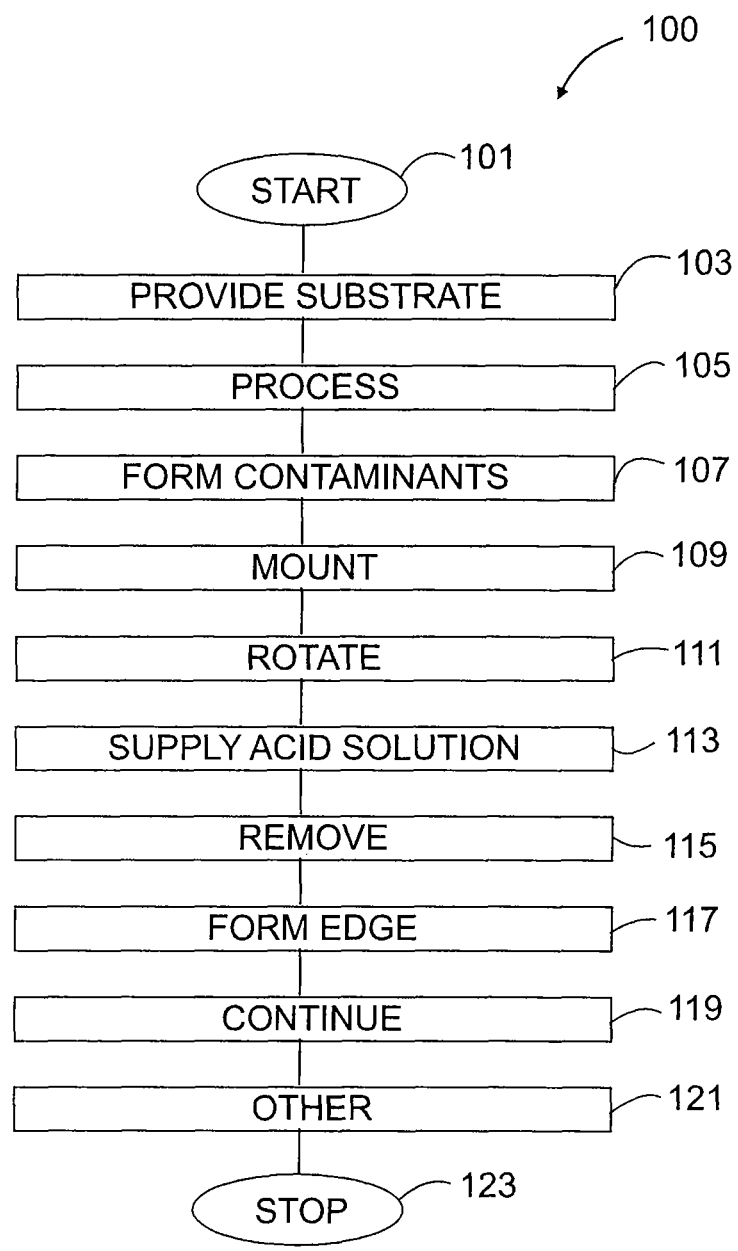
FIG. 1 is a simplified flow diagram illustrating a method for cleaning a backside region of a semiconductor wafer according to an embodiment of the present invention.

According to the present invention, techniques for processing integrated circuits for the manufacture of semiconductor devices are provided. More particularly, the invention provides a method and device for manufacturing a semiconductor substrate using a back side clean, but it would be recognized that the invention has a much broader range of applicability.

A method for manufacturing integrated circuits according to an embodiment of the present invention may be outlined as follows.

1. Provide a semiconductor wafer, which has an upper surface, a backside surface, and an edge region around a periphery of the semiconductor wafer;
2. Subject the semiconductor wafer to one or more process steps to form one or more films of materials on the backside surface;
3. Cause formation of contaminants on the backside surface;
4. Mount the semiconductor wafer to expose the backside surface;
5. Rotate the semiconductor wafer in a circular manner;
6. Supply an acid solution containing fluorine bearing species, a nitric acid species, a surfactant species, and an organic acid species, on at least the backside surface as the semiconductor wafer rotates;
7. Cause removal of one or more contaminants from the backside surface;
8. Form an edge exclusion region within a vicinity of the edge region around the periphery of the semiconductor wafer of at least 0.8 millimeter and greater, while a portion of the center region of the backside surface remains exposed as the semiconductor wafer rotates in the circular manner;
9. Stop supply of acid solution;
10. Rinse semiconductor wafer with cleaning fluid, e.g., water;
11. Dry backside surface of the semiconductor wafer; and
12. Perform other steps, as desired.

The above sequence of steps provides a method according to an embodiment of the present invention. In a specific embodiment, the present invention provides a method and resulting device provided by cleaning a backside surface of a substrate using at least a combination of surfactant and acid species and forming an edge exclusion region. Other alternatives can also be provided where steps are added, one or more steps are removed, or one or more steps are provided in a different sequence without departing from the scope of the claims herein. Details of the present method and structure can be found throughout the present specification and more particularly below.

A method for cleaning a backside of a substrate during the manufacture of integrated circuits according to an embodiment of the present invention may be outlined as follows.

1. Provide a semiconductor wafer, which has an upper surface, a backside surface, and an edge region around a periphery of the semiconductor wafer;
2. Subject the semiconductor wafer to one or more process steps to form one or more films of materials on the backside surface;
3. Cause formation of contaminants on the backside surface;
4. Mount the semiconductor wafer to expose the backside surface;
5. Rotate the semiconductor wafer in a circular manner;
6. Supply an acid solution containing fluorine bearing species, a nitric acid species, a surfactant species, and an organic acid species, on at least the backside surface as the semiconductor wafer rotates;
7. Cause removal of one or more contaminants from the backside surface;
8. Stop supply of acid solution;
9. Rinse semiconductor wafer with cleaning fluid, e.g., water;
10. Dry backside surface of the semiconductor wafer; and
11. Perform other steps, as desired.

The above sequence of steps provides a method according to an embodiment of the present invention. In a specific embodiment, the present invention provides a method and resulting device provided by cleaning a backside surface of a substrate using at least a combination of surfactant and acid species. Other alternatives can also be provided where steps are added, one or more steps are removed, or one or more steps are provided in a different sequence without departing from the scope of the claims herein. Details of the present method and structure can be found throughout the present specification and more particularly below.

FIG. 1 is a simplified flow diagram 100 illustrating a method for cleaning a backside region of a semiconductor wafer according to an embodiment of the present invention. This diagram is merely an example, which should not unduly limit the scope of the claims herein. One of ordinary skill in the art would recognize other variations, modifications, and alternatives. As shown, the method begins with start, step 101. The method provides a semiconductor substrate, e.g., silicon substrate, silicon on insulator substrates, epitaxial silicon, for manufacturing integrated circuits and other devices. The method includes providing (step 103) a semiconductor wafer, which has an upper surface, a backside surface, and an edge region around a periphery of the semiconductor wafer. In a preferred embodiment, the upper surface is often for the manufacture of the integrated circuit device elements themselves, e.g., MOS transistors, capacitors, memory structures.

Figure 2:
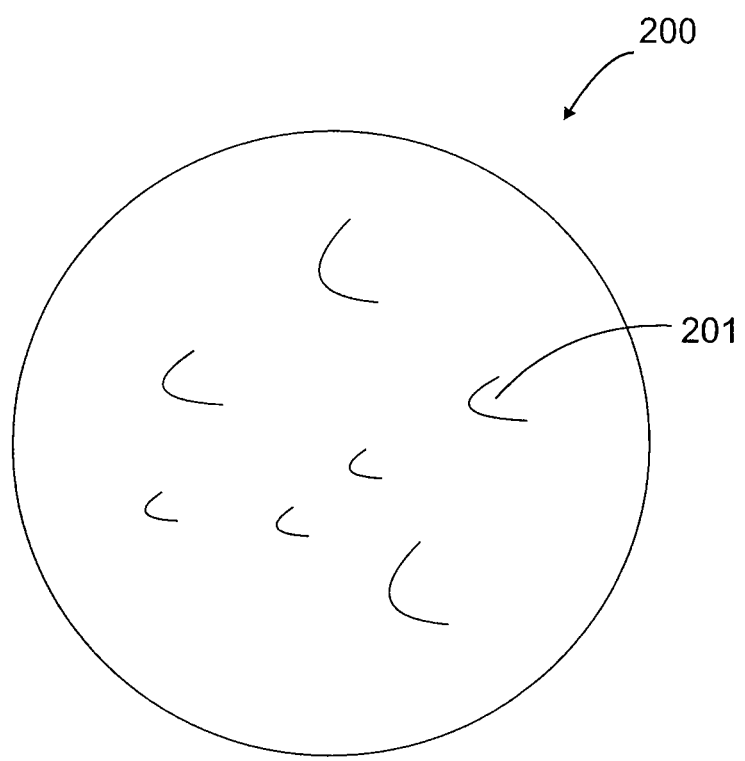
FIGS. 2 through 5 are simplified diagrams illustrating a method for cleaning a backside region of a semiconductor wafer according to an embodiment of the present invention.

In a specific embodiment, the method includes subjecting (step 105) the semiconductor wafer to one or more process steps to form one or more films of materials on the backside surface. In a specific embodiment, the one or more processes can be any of those used in the manufacture of integrated circuits, such as deposition, etching, polishing, plating, implanting, thermal treatment, any combination of these, and others. In a specific embodiment, the semiconductor substrate is characterized by one or more patterns having a 110 nanometer design rule, but can have others. During the manufacture of an integrated circuit, for example, the backside becomes contaminated (step 107) with one or more films that may be attached loosely to certain portions of the backside surface and edge region of the wafer. Referring to FIG. 2, the backside surface 200 is illustrated. One or more particles 201 are also illustrated. These particles, which are contaminants, can include silicon slivers (e.g., needles), portions of deposited films, and/or other undesirable materials. Of course, there can be variations, modifications, and alternatives.

Figure 3:
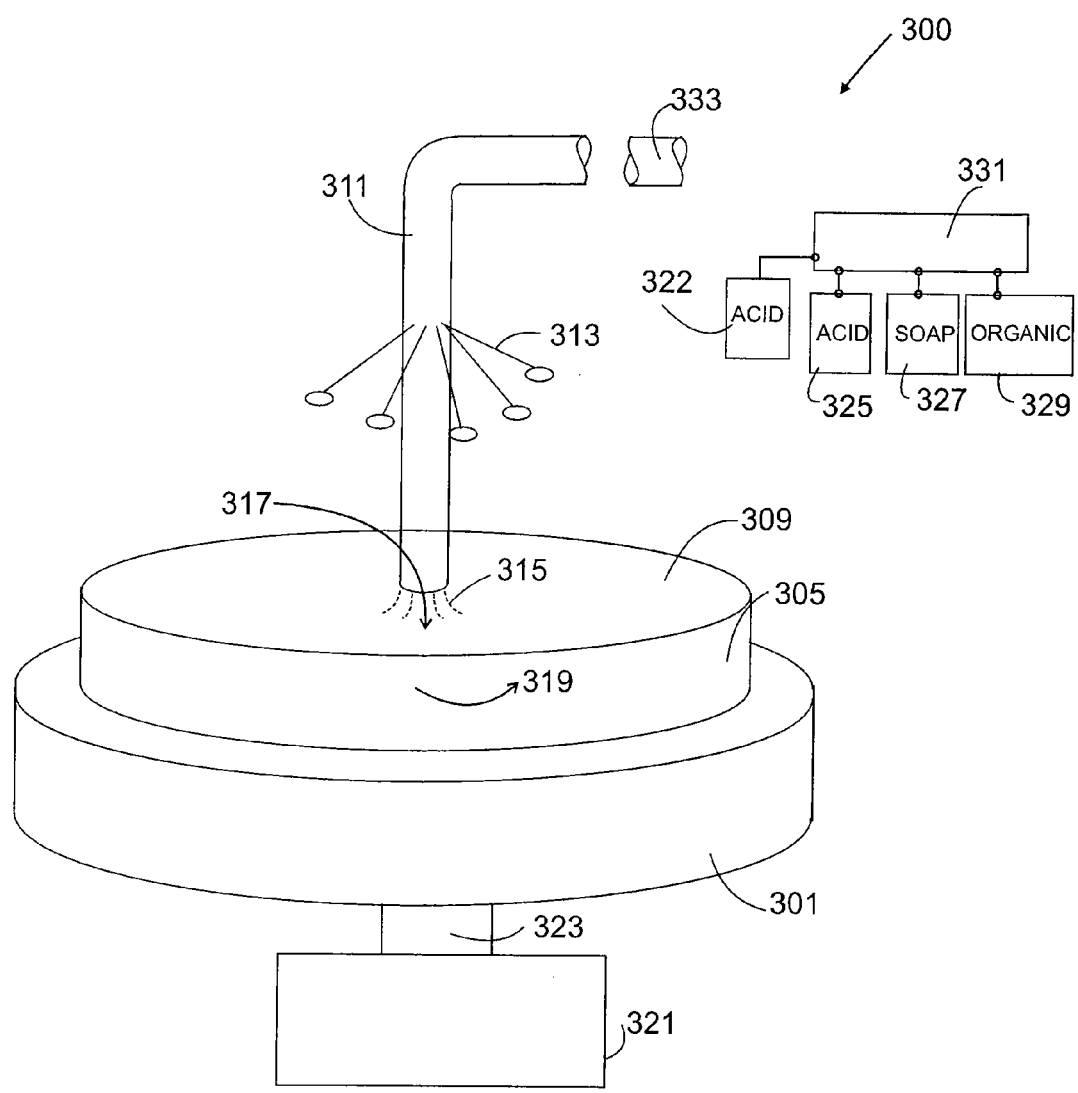

In a specific embodiment, the method mounts (step 109) semiconductor wafer 305 to expose backside surface 309, as also illustrated in FIG. 3. As shown, the wafer is mounted on stage 301, which couples to a rotating member 323, which is provided on a drive motor and/or mechanism 321. As shown, the method rotates 319 (see also step 111) the semiconductor wafer in a circular manner. In a specific embodiment, the rotating is provided at 800 revolutions per minute or greater to about 1200 revolutions per minute. Of course, there can be other variations, modifications, and alternatives. Additionally, the rotating can occur at a constant speed, ramped speed, adjustable speed, and/or other combination of these, depending upon the specific embodiment.

In a specific embodiment, the method includes supplying (step 113) an acid solution containing fluorine bearing species 322, a nitric acid species 325, a surfactant species 327, and an organic acid species 329, on at least the backside surface 309 as the semiconductor wafer rotates. In a preferred embodiment, the acid solution is provided 315 in a direct manner in a center region 317 of the semiconductor wafer using a pipe 311, which couples using piping device 333, to a manifold 331. In a specific embodiment, the manifold couples to chemical sources 322, 325, 327, 329. The manifold may also coupled directly and/or indirectly to a water source, which can include deionized water, ultra-clean water, and the like.

In a specific embodiment, the acid solution can be suitably mixed to achieve desired removal of contaminants and/or form an edge exclusion region of the semiconductor wafer. In a specific embodiment, the fluorine bearing species comprises hydrofluoric acid, commonly called HF. Additionally, the nitric acid species comprises $HNO_3$ according to a specific embodiment. The organic acid species comprises $CH_3COOH$ according to a specific embodiment. The surfactant species reduces a surface tension of the acid solution to facilitate removal of contaminants and form the edge exclusion region, which will be discussed more fully below. In a preferred embodiment, the organic acid species reduces a surface tension of the acid solution. The organic acid species also serves as a buffer species for the acid solution. In a specific embodiment, the acid solution has a mixture of $HNO_3$:HF:surfactant:$CH_3COOH$ at ratios of about 160:1:30:8, but can be others. As merely an example, a specific recipe can be summarized as follows:

1. Mix $HNO_3$/HF with surfactant and $CH_3COOH$ (the surfactant can decrease the surface tension force of the mixed liquid; the $CH_3COOH$ serves as buffer agent to avoid $HNO_3$ from dissociating too fast and increase chemical lifetime; while the $CH_3COOH$ can also help to decrease the surface tension force of the mixed liquid);
2. The ratio of the mixture can be 160:1:30:8 ($HNO_3$:HF: surfactant:$CH_3COOH$);
3. Certain detailed of the recipe can be provided below:
    Chemical: $HNO_3$+HF+surfactant+$CH_3COOH$ (160:1:30:8)
    $HNO_3$: oxidizer, Si+$HNO_3$→$SiO_2$
    HF: etch $SiO_2$
    Surfactant: increase wafer front side undercut and etch uniformity
    $CH_3COOH$: buffer agent, avoid $HNO_3$ from dissociating too fast
    Room temp Of course, there can be other variations, modifications, and alternatives.

In a specific embodiment, the method causes removal (step 115) of one or more contaminants from the backside surface. In a specific embodiment, the method also forms an edge exclusion region (step 117) within a vicinity of the edge region around the periphery of the semiconductor wafer of at least 0.8 millimeter and greater, while a portion of the center region of the backside surface remains exposed as the semiconductor wafer rotates in the circular manner. In a preferred embodiment, the edge exclusion region can have a silicon nitride coating or a polysilicon material. The method continues (step 119) until the edge has been formed and the backside is clean and substantially free from contaminants according to an embodiment of the present invention.

Figure 4:
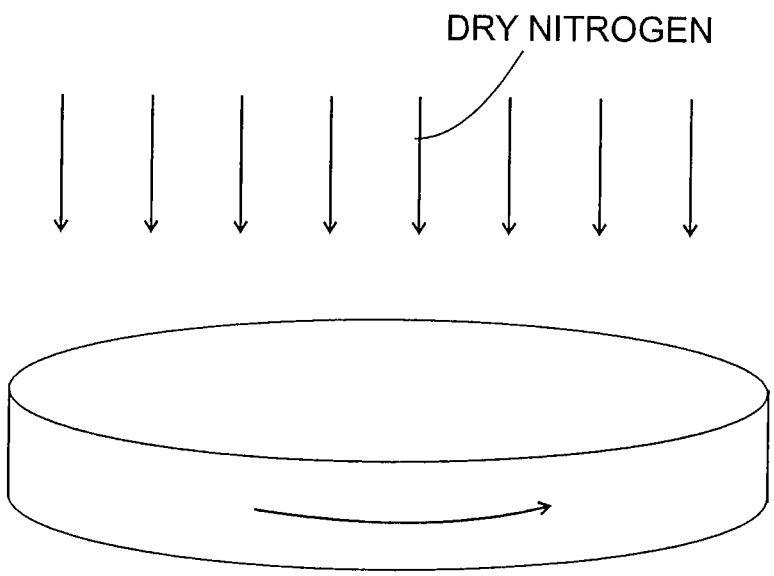

In a specific embodiment, the method also performs other (step 121) processes. That is, the method can include cleaning the acid solution from the semiconductor substrate using a water solution 313. In a preferred embodiment, the water solution can be provided in a spray or through the nozzle. Additionally, the method further includes drying the semiconductor substrate using a nitrogen gas, which is clean and dry, as illustrated by the simplified diagram of FIG. 4. Once the wafer has been dried, the method can stop, step 123. Of course, there can be other variations, modifications, and alternatives.

Figure 5:
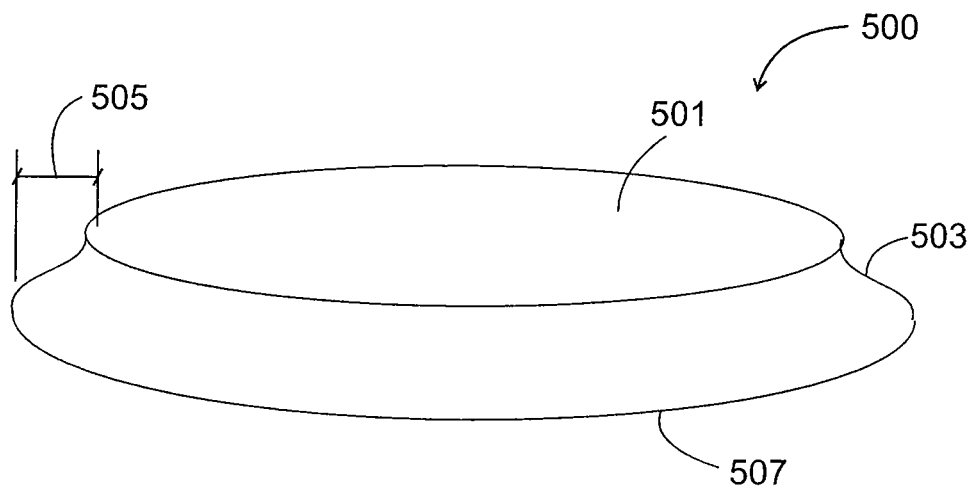

Referring to FIG. 5, semiconductor wafer 500 is illustrated. The wafer has one or more patterned films 501 thereon. The wafer also has a backside surface 507, which is substantially clean and free from contaminants. In a specific embodiment, the wafer has edge region 503, which is formed using the present method. The edge region has a width 505. The width is least 0.8 millimeter and greater according to a specific embodiment. The edge region can have a coating such as silicon nitride, polysilicon, or other suitable material, or may also be exposed silicon having a thin layer of oxide species. Of course, there can be other variations, modifications, and alternatives.

Experiment:

To illustrate the present invention, we performed experiments. The experiments were performed using rugged polysilicon material for capacitor structures in memory devices using 0.11 µm design rule. The rugged polysilicon material was deposited using a chemical vapor deposition process but can be others.

Figure 6:
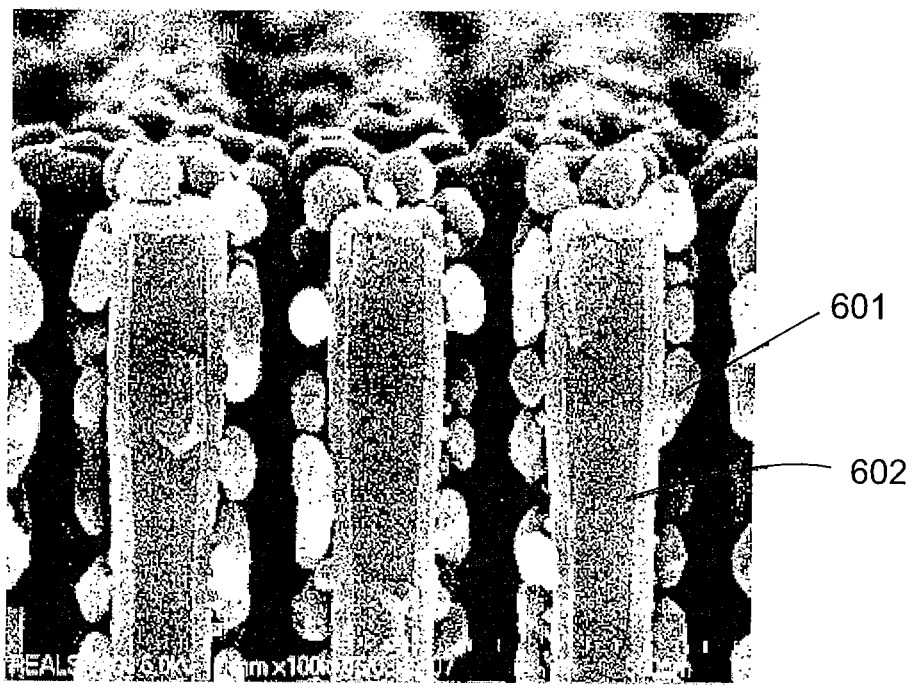
FIG. 6 is an exemplified cross sectional SEM of a capacitor structure according to an embodiment of the present invention.

Referring to FIG. 6, a cross section scanning electron micrograph (SEM) of capacitor structures for a memory device using rugged polysilicon film is shown. As shown, rugged polysilicon grains 601 overlies underlying electrode 602. The rugged polysilicon material increases capacitor electrode area and capacitance of memory devices. However, such rugged polysilicon material causes defects and device failures using conventional method of fabricating memory cells. In addition, rugged polysilicon film is also formed simultaneously on wafer backside during polysilicon deposition process, further causing defects, as discussed below.

Figure 7:
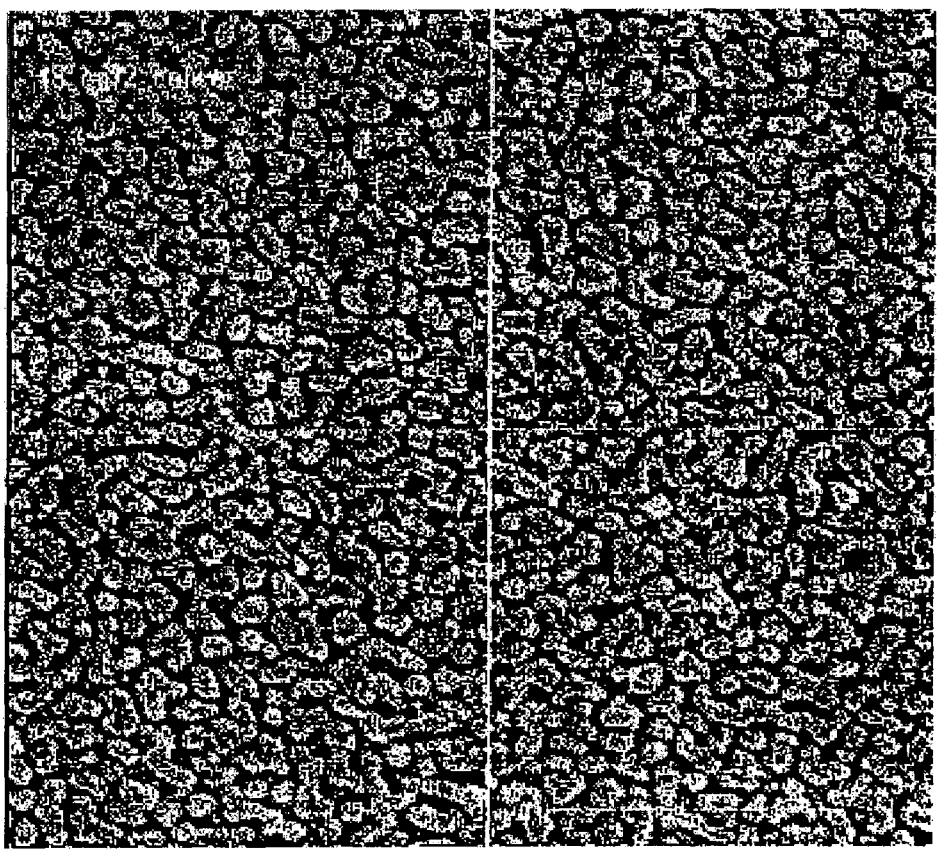
FIG. 7 is an exemplified SEM of a back side of a semiconductor wafer according to an embodiment of the present invention.

FIG. 7 is a scanning electron micrograph (SEM) showing rugged polysilicon on wafer backside. As shown, the wafer backside is uniformly covered with a highly textured rugged polysilicon film. Such rugged polysilicon film is prone to flaking and peeling, resulting in defects, device failure, and yield loss.

Figure 8:
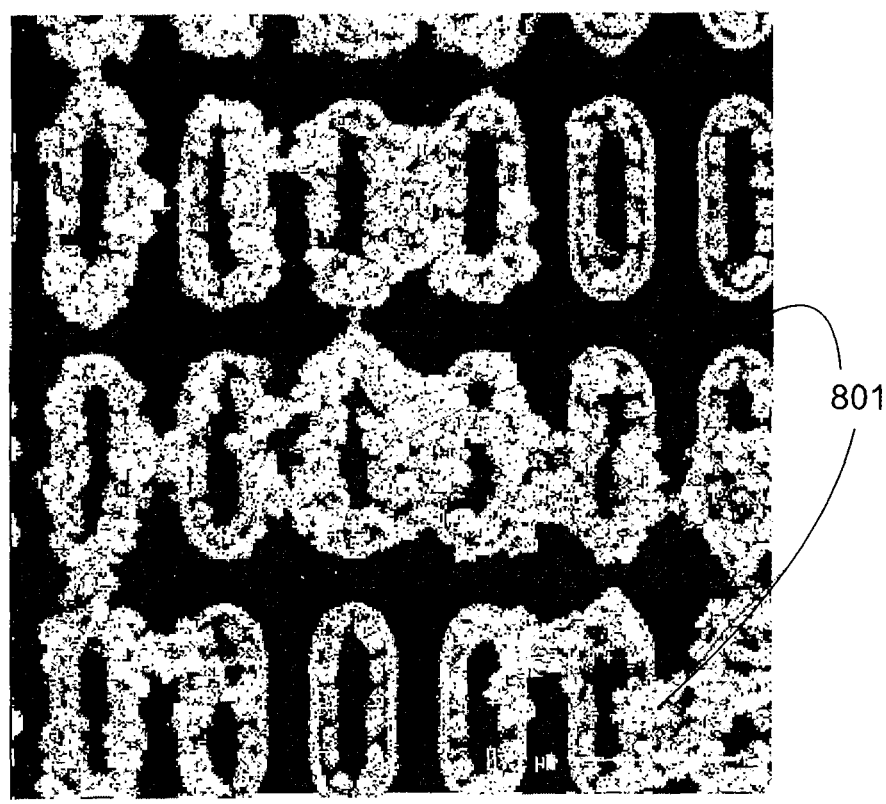
FIGS. 8 and 9 are an exemplified SEM of capacitor structures according to a conventional method of fabricating a semiconductor wafer.
Figure 9:
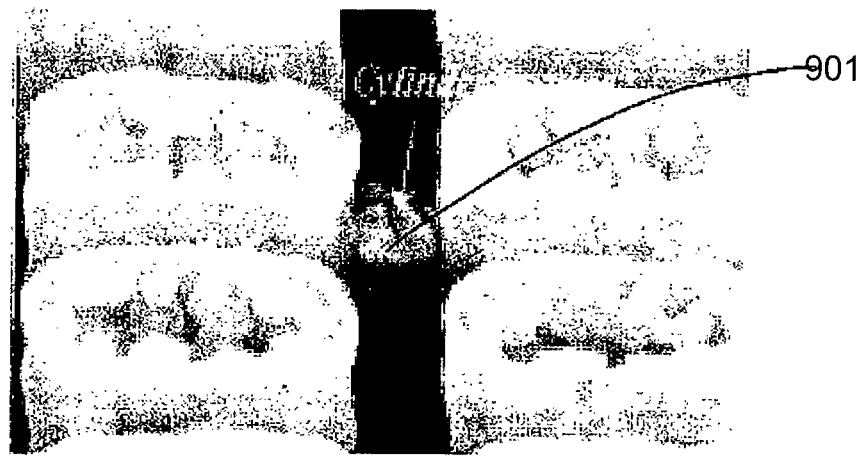
Figure 10:
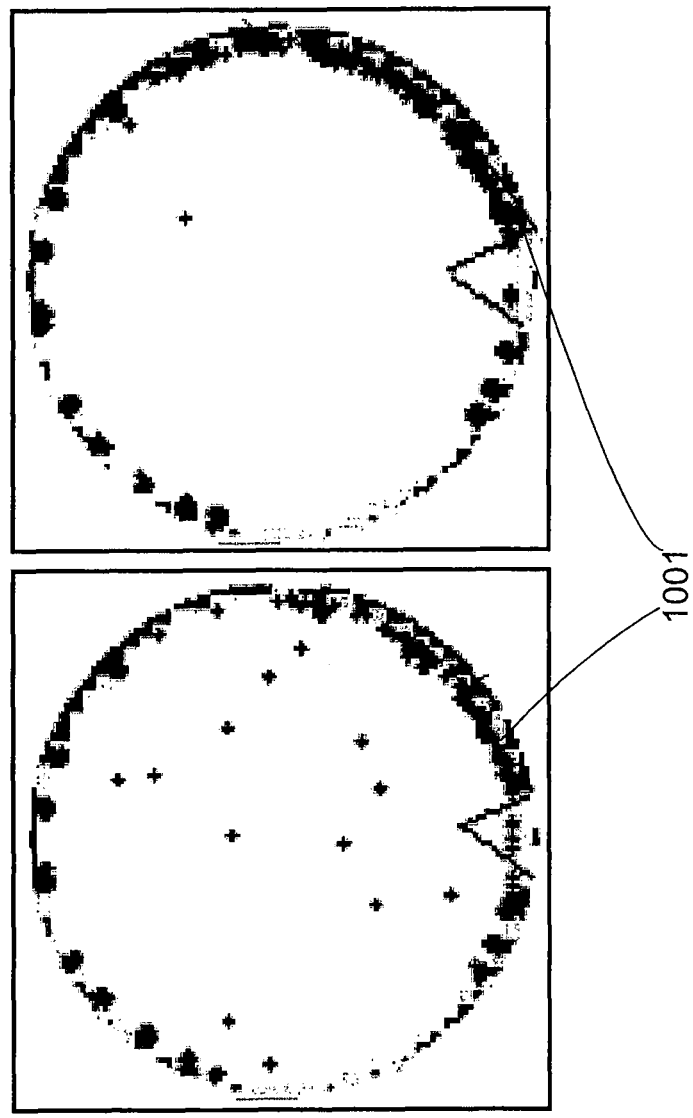
FIG. 10 is a simplified diagram showing defect density maps according to a conventional method of fabricating a semiconductor wafer.

FIG. 8 is a scanning electron micrograph (SEM) showing a top-view of capacitor structures according to a conventional method of fabricating a memory device. As shown, defects 801 are formed on the capacitor structures. Such defects cannot be removed using conventional front side wet-clean process. In fact, the conventional front side wet-clean process may further redistribution defects across the device surface and cause problems in subsequent process steps. In an enlarged SEM picture as shown in FIG. 9, defect 901 causes bridging of neighboring capacitors and pair bit failure in the device, impacting an overall device yield. A corresponding defect density map is shown in FIG. 10. As shown in FIG. 10, defects occur primarily in wafer periphery area 1001. These defects were analyzed using energy dispersive spectroscopy (EDS) and silicon was shown to be the dominant element. Accordingly, a method for a polysilicon backside etch is provided and defects are eliminated.

Figure 11:
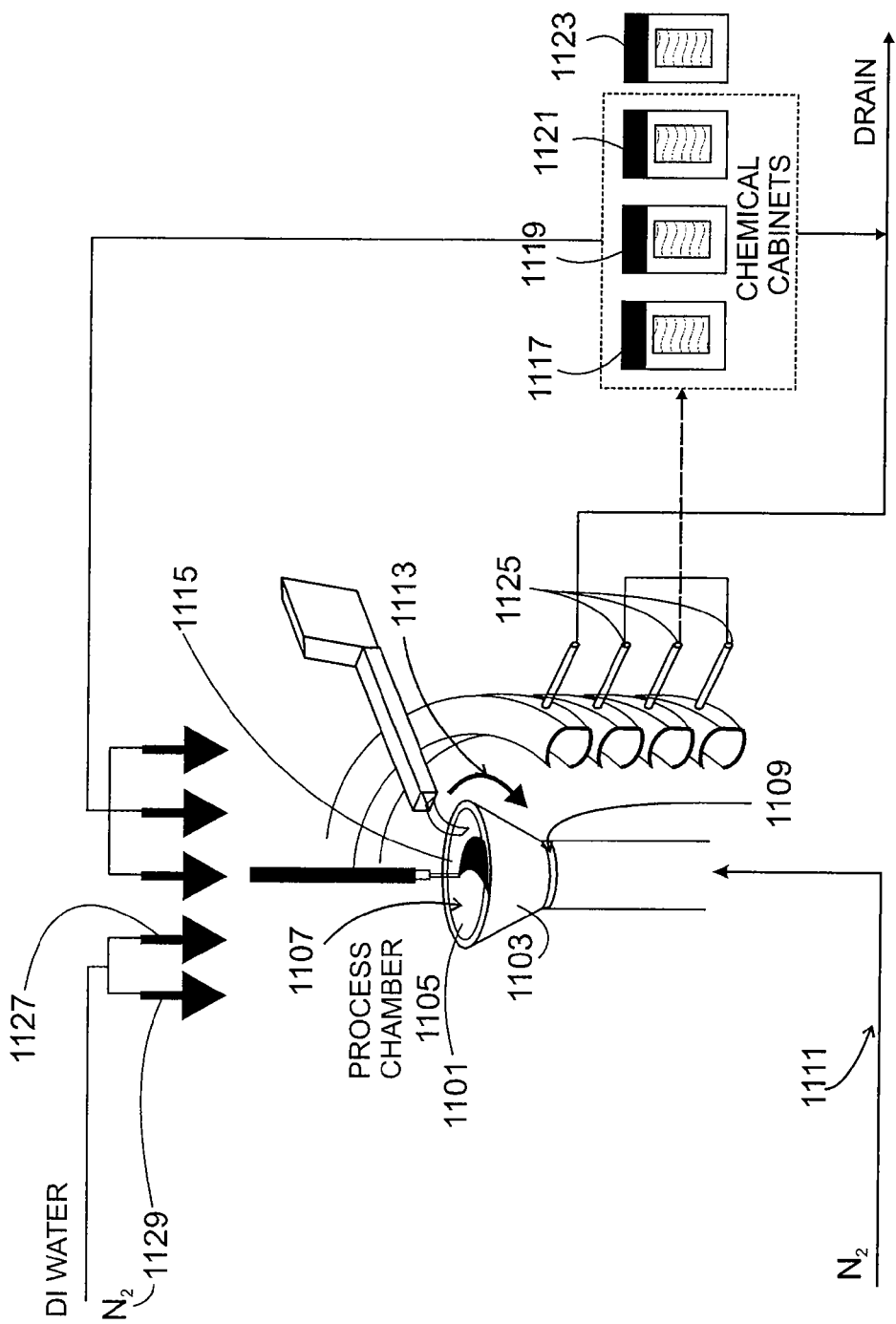
FIG. 11 is a simplified diagram illustrating an apparatus for cleaning a backside region of a semiconductor wafer according to an embodiment of the present invention.

FIG. 11 is a simplified diagram illustrating an apparatus for wafer backside etch according to an embodiment of the present invention. As shown, a semiconductor wafer 1101 is mounted on a Bernoulli chuck 1103 in a process chamber 1105 to expose wafer backside surface 1107. The semiconductor wafer has one or more films or materials (e.g., polysilicon material) formed on the wafer backside surface. The Bernoulli chuck couples to a rotating member provided on a drive motor and/or mechanism (not shown). A gas (e.g., $N_2$) is provided 1111 between the wafer and the Bernoulli chuck to maintain a constant distance between the chuck and the wafer. As shown, the semiconductor wafer is rotated in a circular manner 1113. In a specific embodiment, the rotation is provided at 800 revolutions per minute or greater to about 1200 revolutions per minute. The rotation speed used depends on the application. The apparatus also provides an acid solution 1115 on at least the wafer backside surface while the wafer rotates. The acid solution comprises at least an HF species 1117, a $HNO_3$ species 1119, a surfactant 1121, and an organic acid 1123 (e.g., $CH_3COOH$) in a specific embodiment. The acid solution is provided through a manifold 1125 and mixed before delivered to the wafer backside surface. The manifold is coupled to chemical sources 1117, 1119, 1121, and 1123. Of course the number of chemical sources depends on the application. The acid solution is provided in a ratio that favors an etch selectivity of, for example, polysilicon to underlying film material (e.g., $SiO_2$) in a specific embodiment. For example, a ratio of $HNO_3$:HF:surfactant:$CH_3COOH$ of 160:1:30:8 can be used. The surfactant is provided to decrease surface tension of the acid solution. The organic acid (e.g., $CH_3COOH$) is provided as a buffer and to decrease surface tension of the acid solution. The acid solution removes, for example, the polysilicon material from the wafer backside surface and forms an edge exclusion region on device side of the wafer. Additionally, the apparatus includes a water source 1127 to remove residual acid solution from the wafer. A $N_2$ source 1129 is provided to facilitate drying. Once the wafer has been dried, other processes may be performed to complete the device. Accordingly, the apparatus provides a backside etch process and provides an edge exclusion region on the device side of the wafer. Accordingly, defects are eliminated, improving device yields.

Figure 12:
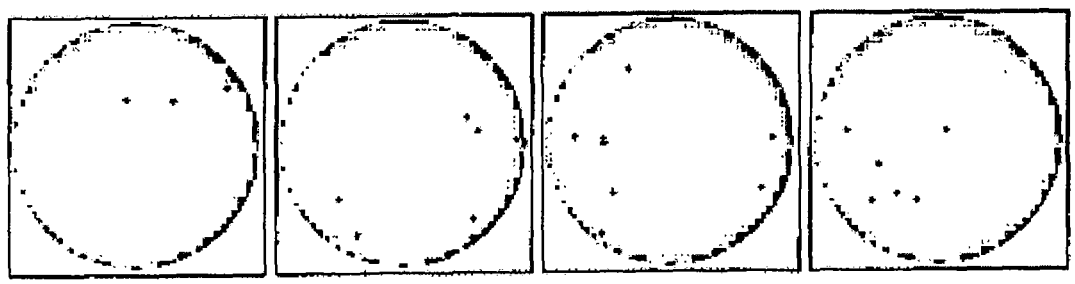
FIG. 12 is a simplified diagram showing defect density map according to an embodiment of the present invention.

Referring to FIG. 12, a defect density map after implementation of a polysilicon backside etch process according to embodiments of present invention is shown. As shown, defects in the periphery wafer region are reduced. Accordingly, device yield is increased as illustrated in FIG. 13.

Figures 13A, 13B:
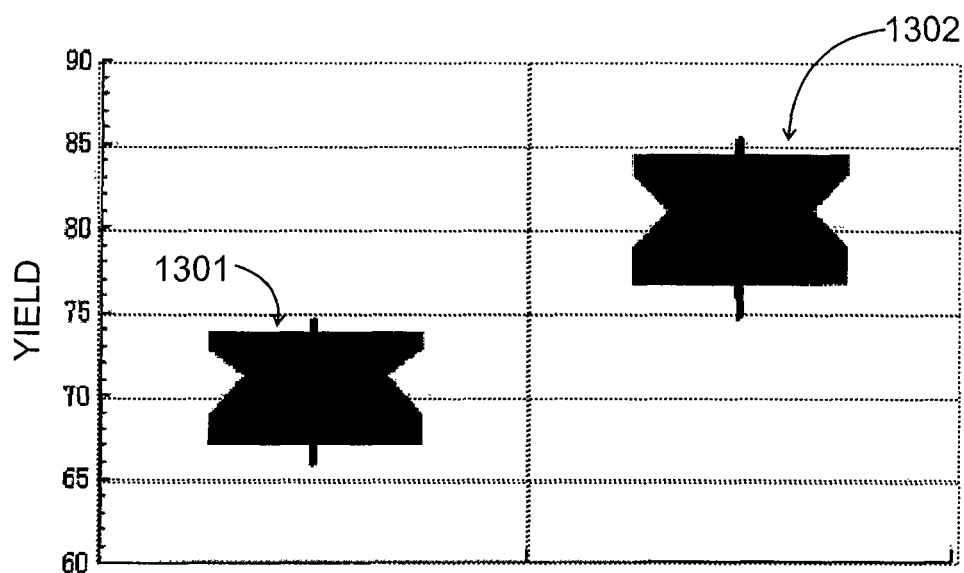
FIG. 13 is a simplified diagram illustrating a plot for device yield according to an embodiment of the present invention.

FIG. 13 is a simplified diagram showing device yield according to an embodiment of the present invention. As shown in FIGS. 13A and 13B, device yield increased from 70.79% (data point 1301) to 80.75% (data point 1302) when rugged polysilicon backside etch step is implemented. Of course there can be other variations and modifications.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing semiconductor substrates, the method comprising:
    providing a semiconductor wafer, the semiconductor wafer having an upper surface, a backside surface, and an edge region around a periphery of the semiconductor wafer;
    subjecting the semiconductor wafer to one or more process steps to form one or more films of materials on the backside surface;
    mounting the semiconductor wafer to expose the backside surface;
    rotating the semiconductor wafer in a circular manner;
    supplying an acid solution containing fluorine bearing species, a nitric acid species, a surfactant species, and an organic acid species, on at least the backside surface of the semiconductor wafer as the semiconductor wafer rotates;
    causing removal of one or more contaminants from at least the backside surface; and
    forming an edge exclusion region within a vicinity of the edge region around the periphery of the semiconductor wafer of at least 0.8 millimeter and greater, while a portion of the center region of the backside surface remains exposed as the semiconductor wafer rotates in the circular manner;
    wherein the one or more contaminants comprise a first polysilicon material;
    wherein the edge exclusion region comprises a second polysilicon material; and
    wherein the acid solution comprises a mixture of nitric acid (HNO3), hydrofluoric acid (HF), surfactant, and acetic acid (CH3COOH) in a 160:1:30:8 ratio,
    wherein the one or more contaminants comprise one or more silicon bearing needle structures.

2. The method of claim 1 wherein the rotating is provided at 800 revolutions per minute to about 1200 revolutions per minute.

3. The method of claim 1 wherein the surfactant species reduces a surface tension of the acid solution.

4. The method of claim 1 wherein the organic acid species reduces a surface tension of the acid solution.

5. The method of claim 1 wherein the organic acid species serves as a buffer species.

6. The method of claim 1 wherein the one or more contaminants comprises one or more particles.

7. The method of claim 1 wherein the semiconductor substrate is characterized by one or more patterns having a 110 nanometer design rule.

8. The method of claim 1 further comprising cleaning the acid solution from the semiconductor substrate using a water solution.

9. The method of claim 8 further comprising drying the semiconductor substrate using a nitrogen gas.

* * * * *